United States Patent [19]
Hashimoto

[11] Patent Number: 5,351,212
[45] Date of Patent: * Sep. 27, 1994

[54] NON-VOLATILE SEMICONDUCTOR MEMORY DEVICE EQUIPPED WITH HIGH-SPEED SENSE AMPLIFIER UNIT

[75] Inventor: Kiyokazu Hashimoto, Tokyo, Japan

[73] Assignee: NEC Corporation, Tokyo, Japan

[*] Notice: The portion of the term of this patent subsequent to Mar. 8, 2011 has been disclaimed.

[21] Appl. No.: 108,541

[22] Filed: Aug. 19, 1993

Related U.S. Application Data

[62] Division of Ser. No. 774,216, Oct. 9, 1991, Pat. No. 5,293,333.

[30] Foreign Application Priority Data

Oct. 11, 1990 [JP] Japan .................................. 2-272571

[51] Int. Cl.$^5$ .............................................. G11C 11/40
[52] U.S. Cl. ................................ 365/189.09; 365/207; 365/189.07; 365/185
[58] Field of Search .............. 365/210, 189.09, 189.07, 365/205, 196, 207, 208, 185

[56] References Cited

U.S. PATENT DOCUMENTS

| | | | |
|---|---|---|---|
| 4,751,682 | 6/1988 | Matsuoka et al. | 365/210 |
| 4,758,748 | 7/1988 | Takeuchi | 307/530 |
| 4,761,765 | 8/1988 | Hashimoto | 365/185 |
| 4,802,138 | 1/1989 | Shimamune | 365/210 |
| 4,903,237 | 2/1990 | Rao | 365/185 |

*Primary Examiner*—Eugene R. LaRoche
*Assistant Examiner*—Vu Le
*Attorney, Agent, or Firm*—Burns, Doane, Swecker & Mathis

[57] ABSTRACT

An electrically erasable and programmable read only memory device has a sense amplifier circuit for changing an output voltage level at the output node thereof indicative of either an erased or a write-in state of a memory cell to be accessed, and the output voltage level is compared with a reference voltage level so as to see whether the output voltage is indicative of the erased state or the write-in state, wherein the sense amplifier circuit is associated with a current make-up circuit for compensating the current to the output node of the sense amplifier circuit so that the output voltage level rapidly reaches a high or low voltage level regardless of fluctuation of the reference voltage level.

4 Claims, 8 Drawing Sheets

NON-VOLATILE SEMICONDUCTOR MEMORY DEVICE EQUIPPED WITH HIGH-SPEED SENSE AMPLIFIER UNIT

This application is a divisional of application Ser. No. 07/774,216, filed Oct. 9, 1991, now U.S. Pat. NO. 5,293,333 issued Mar. 8, 1994.

FIELD OF THE INVENTION

This invention relates to a non-volatile semiconductor memory device such as, for example, an electrically erasable and programmable read only memory device and, more particularly, to a sense amplifier incorporated in the non-volatile semiconductor memory device.

DESCRIPTION OF THE RELATED ART

A typical example of the electrically erasable and programmable read only memory device is illustrated in FIG. 1 of the drawings. The prior art electrically erasable and programmable read only memory device is of the type producing eight output data bits, and, accordingly, has eight memory cell arrays 21 to 28 each associated with a data output facility. However, only one data output facility is shown in FIG. 1 for the sake of simplicity. The data output facility largely comprises a selector unit 2 provided for the memory cell array 21, a sense amplifier unit 3 coupled with the selector unit 2, a reference unit 4, a comparator unit 5 coupled with the sense amplifier unit 3 and the reference unit 4, and a data output unit 6 coupled with the comparator unit 5. The memory cell array 21 is implemented by floating gate type field effect transistors M11, Mm1, M1n and Mmn, and the control gate electrodes of the floating gate type field effect transistors M11 to Mmn are coupled with word lines WL1 to WLm, and the source nodes of all the floating gate type field effect transistors M11 to Mmn are grounded. Each of the floating gate type field effect transistors M11 to Mmn selectively enters an erased state and a write-in state which correspond to two threshold levels different from each other. Namely, when the floating gate type field effect transistor is exposed to ultra-violet light, electrons are evacuated from the floating gate electrode, and the threshold level is lowered. The floating gate type field effect transistor with the lowered threshold level remains erased, i.e., the erased state. On the other hand, if hot electrons are injected into the floating gate electrode, the threshold level is lifted, and the floating gate type field effect transistor enters the write-in state.

A large number of floating gate type field effect transistors M11 to Mmn are grouped so as to form memory cell blocks, and the memory cell blocks are respectively coupled through digit lines DG1 to DGn with transfer transistors TR1 to TRn of the selector unit 2. A node N1 of the sense amplifier unit 3 is shared between the transfer transistors TR1 to TRn, and is coupled with the input node of an inverting circuit 3a as well as a gate transistor 3b. The gate transistor 3b is gated by the inverting circuit 3a, and current is supplied from a source of positive voltage level Vcc through a transfer gate 3c or a parallel combination of an n-channel enhancement type field effect transistor Qn and a p-channel enhancement type field effect transistor Qp to the gate transistor 3b. An output node N2 of the sense amplifier unit 3 is provided between the transfer gate 3c and the gate transistor 3b, and is coupled with one of the two input nodes of the comparator unit 5.

Though not shown in FIG. 1, the reference unit 4 is implemented by a series combination of a dummy memory cell, a dummy column selector and a dummy sense amplifier circuit. The dummy memory cell and the column selector respectively correspond to one of the floating gate type field effect transistors M11 to Mmn, and the dummy sense amplifier unit is similar to the sense amplifier unit 3 except for the channel width-to-channel length ratio of the p-channel enhancement type field effect transistor corresponding to Qp. The p-channel enhancement type field effect transistor of the dummy sense amplifier unit is three times larger in channel width-to-channel length ratio than the p-channel enhancement type field effect transistor Qp. Therefore, the reference unit 4 produces a reference voltage level Vref at the output node 4a, and the reference voltage level Vref is usually regulated to an intermediate point between the output voltage level Vsa(on) at the output node N2 upon access of a floating gate type field effect transistor in the erased state and the output voltage level Vsa(off) at the output node N2 upon access of a floating gate type field effect transistor in the write-in state. The comparator unit 5 compares the voltage level Vsa at the output node N2 with the reference voltage level Vref for determining the state of a selected floating gate type field effect transistor. Upon determination of the state, the comparator unit 5 reports it to the data output unit 6, and the data output unit 6 produces an output data signal indicative of the state of the selected floating gate type field effect transistor. Namely, if the voltage level Vsa is higher than the reference voltage level Vref by a predetermined-value, the comparator unit 5 supplies an output signal Vdo of a low voltage level to the data output unit 6. On the other hand, the voltage level Vsa lower than the reference voltage level Vref results in the output signal Vdo of a high voltage level.

In the following description, the n-channel enhancement type field effect transistor and the p-channel enhancement type field effect transistor are assumed to have a threshold level Vtn of 1.0 volt and a threshold level Vtp of −1.0 volt, and the erased state and the write-in state are equivalent to the logic "0" level and the logic "1" level, respectively. FIG. 2 shows the relation between the currents I1 and I2 and the voltage level on a selected digit line. When the floating gate type field effect transistor Mm1 in the erased state is accessed, the voltage level of the associated digit line DG1 is balanced with the current passing therethrough at point P1, and the digit line DG1 has the voltage level Vdg(on). On the other hand, the digit line DG1 has the voltage level Vdg(off) upon access of the floating gate type field effect transistor M11, because the amount of the current I2 is approximately equal to zero. The profile of the current I2 to the voltage level on the selected digit line is determined by the gate width-to-gate length ratios of the field effect transistors Qn, Qp and 3b as well as the input voltage-to-output voltage characteristics of the inverting circuit 3a. However, since the transfer transistor 3b is gated by the inverting circuit 3a, the prolife is roughly dominated by the gate width-to-gate length ratio of the gate transistor 3b and the input voltage-to-output voltage characteristics of the inverting circuit 3a, and the voltage level Vdg(off) is approximately equal to the threshold level of the inverting circuit 3a. The gradient of the profile of the current I2 is dominated by the gain of the inverting circuit 3a and the gate width-to-gate length ratio of the gate transistor 3b. As described hereinbefore, the inverting circuit 3a is responsive to the voltage level at the input node N1 and, accordingly, to the voltage level Vdg on a selected digit line, and determines the output voltage level Vsa at the output node N2. FIG. 3 shows the relation between the output voltage levels Vsa and Vdg. If the voltage level Vdg is equal to or greater than the voltage level Vdg(on), the output voltage level Vsa is lower than the positive voltage level Vcc by the threshold level Vtp of the p-channel enhancement type field effect transistor Qp, and is labeled with Vsa(off). While the voltage level Vdg is lowered from the voltage level Vdg(off), the gate transistor 3b turns on, and the output node N2 is decayed depending upon the difference therebetween. However, if a floating gate type field effect transistor in the erased state is accessed, the voltage level Vsa reaches point P2, and the output node N2 is regulated to Vsa(on). The gradient of the plots indicative of the output voltage level Vsa is determined by the channel with-to-channel length ratio of the p-channel enhancement type field effect transistor Qp, and the channel width-to-channel length ratio of the p-channel enhancement type field effect transistor Qp is selected in such a manner that the voltage difference between the reference voltage Vref and the output voltage level Vsa(on) is large enough to be judged by the comparator unit 5, and the p-channel enhancement type field effect transistor Qp is smaller in the channel width-to-channel length than the n-channel enhancement type field effect transistors Qn and 3b.

The gain of the inverting circuit 3a is large enough to quickly switch the gate transistor 3b, and the threshold level of the inverting circuit 3a is approximately equal to the threshold level Vtn of the n-channel enhancement type field effect transistors. Plot Vr is indicative of variation of the reference voltage level Vref when the voltage level at a node N31 of the reference unit 4 corresponding to the digit line DG1 or DGn is changed.

The sequential access of the floating gate type field effect transistors M11 and Mm1 are illustrated in FIG. 4. The floating gate type field effect transistor M11 is in the write-in state, and the floating gate type field effect transistor Mm1 remains erased. Row address bits lift the word line WL1, and the word line WLm is decayed at time t1. The column address bits cause the decoded signal line DL1 to go up, and the digit line DG1 is coupled through the transfer transistor TR1 with the input node N1. Since the floating gate type field effect transistor M11 has entered the write-in state, the threshold level of the floating gate type field effect transistor M11 is higher than the voltage level on the selected word line WL1. For this reason, the floating gate type field effect transistor M11 hardly turns on, and no current path is established from the digit line DG1 to the ground. The digit line DG1 and the input node N1 are charged from the source of positive voltage level Vcc, and are increased in voltage level. The inverting circuit 3a decreases the voltage level at the output node thereof, and the gate transistor 3b is shifted to the off-state. The output node N2 is charged by the source of positive voltage level Vcc, and, accordingly, starts increasing the output voltage level Vsa toward the voltage level Vsa(off) at time t2. However, since the gate electrode of the p-channel enhancement type field effect transistor Qp is coupled with the drain node thereof, the current driving capability of the p-channel enhancement type field effect transistor is gradually decreased, and the voltage level Vsa is slowly increased when close to the voltage level Vsa(off). If the output node N2 exceeds the threshold level (Vref+a) of the comparator unit 5 at time t3, the output voltage signal Vdo starts decaying from the positive voltage level Vcc toward the ground voltage level. The steeper the voltage level Vsa rises, the faster the output voltage signal Vdo decays. The output voltage signal Vdo is supplied to the data output unit 6, and the data output unit 6 shifts the output data signal OUT from the ground voltage level to the positive voltage level Vcc. The access time period is indicated by T11.

Subsequently, the row address bits designate the floating gate type field effect transistor Mm1 of the erased state, and the word line WLm starts increasing at time t5. However, the word line WL1 is decayed from the positive voltage level Vcc. The column address bits keep the transfer transistor TR1 on, and the input node N1 is coupled with the digit line DG1. Since the floating gate type field effect transistor Mm1 is in the erased state, a current path is produced through the floating gate type field effect transistor Mm1, and the current I1 flows from the digit line DG1 through the floating gate type field effect transistor Mm1 to the ground node. The digit line DG1 and the input node N1 are discharged, and the input node N1 is decreased in voltage level. On the contrary, the inverting circuit 3a gradually elevates the output node thereof, and the gate transistor 3b turns on at time t6. Then, the output node N2 is decayed from the voltage level Vsa(off) toward the voltage level Vsa(on). If the voltage level Vsa crosses another threshold level (Vref−a) of the comparator unit 5 at time t7, the comparator unit 5 changes the output voltage signal Vdo from the ground voltage level toward the positive voltage level Vcc. With the output voltage signal Vdo, the data output unit 6 shifts the data output signal OUT from the positive voltage level Vcc toward the ground voltage level at time t8. Tm1 is indicative of the access time to the floating gate type field effect transistor Mm1. The absolute value of the gradient of the voltage level Vsa in the access to the floating gate type field effect transistor Mm1 is also proportional to the absolute value of the gradient of the output voltage signal Vdo.

As described hereinbefore, the reference voltage level Vref is adjusted to an intermediate level between the voltage levels Vsa(on) and Vsa(off). However, fluctuation of the reference voltage level Vref is unavoidable. If the reference voltage level is slightly lifted up to Vref1, the reference voltage level Vref1 traces plot Vr1 depending upon the voltage level at the node N31 as shown in FIG. 3, and the access time to the floating gate type field effect transistor M11 is prolonged as shown in FIG. 4. In detail, the output node N2 gradually decelerates the voltage level Vsa when getting close to the voltage level Vsa(off), and the reference voltage level Vref1 causes the threshold level of the comparator unit 5 to go up to (Vref1−a). The decelerated voltage level Vsa makes the comparator unit 5 less sensitive, and the output voltage signal Vdo starts on decaying at time t3′. The comparator unit 5 retards the switching action thereof, and the output voltage signal Vdo is decreased slower than that in the reference voltage level Vref as indicated by plots Vdo′, because the voltage level Vsa is decelerated. The data output unit 6 also retards the switching action, and the output data signal OUT traces plots OUT′, and the access time period T11 is prolonged.

Thus, the prior art electrically erasable and programmable read only memory device encounters a problem in that the access time period is prolonged due to the fluctuation of the reference voltage level Vref. This is because of the fact that the p-channel enhancement type field effect transistor Qp decelerates the voltage level Vsa when getting close to the voltage level Vsa (off) or (Vcc−Vtp). Moreover, the fluctuation of the reference voltage level Vref decreases the noise margin.

Another problem inherent in the prior art electrically erasable and programmable read only memory device is that the sense amplifier unit 3 requires a relatively high positive voltage level Vcc. Since the n-channel enhancement type field effect transistors have the same threshold level Vtn, the input node N1 is biased to 1 volt, and the minimum voltage level Vcc(min) is as high as the total sum of the absolute value of the threshold level Vtp and the threshold level Vtn. In the prior art electrically erasable and programmable read only memory device, the threshold levels Vtn and Vtp are assumed to be 1.0 volt and −1.0 volt, and the minimum voltage level Vcc(min) is as high as 2 volts.

SUMMARY OF THE INVENTION

It is therefore an important object of the present invention to provide a high-speed non-volatile semiconductor memory device which is equipped with a sense amplifier unit free from fluctuation of a reference voltage level.

To accomplish these objects, the present invention proposes to supplement current to the output node of a sense amplifier unit.

In accordance with the present invention, there is provided a non-volatile semiconductor memory device fabricated on a single semiconductor chip, comprising: a) a plurality of memory cells each selectively entering first and second states for changing the amount of current passing therethrough; b) a selecting means for selecting one of the plurality of memory cells; c) a sense amplifier unit for producing an output voltage level indicative of one of the first and second states, and having an input node coupled with the aforesaid one of the plurality of memory cells, a gate means shifted between on and off states depending upon the state of the aforesaid one of the plurality of memory cells for controlling a current path between the input node and an output node, a current supplying circuit for controlling the amount of current supplied from a first source of voltage level to the output node, and a make-up circuit for constantly supplementing current to the output node until the output node reaches a predetermined voltage level as high as the first source of voltage level; and e) a comparator means having a first input node coupled with the output node of the sense amplifier unit and a second input node coupled with the output node of the reference unit, and operative to compare the output voltage level with the reference voltage level for producing an output voltage signal indicative of the aforesaid one of the first and second states.

BRIEF DESCRIPTION OF THE DRAWINGS

The features and advantages of the non-volatile semiconductor memory device according to the present invention will be more clearly understood from the following description taken in conjunction with the accompanying drawings in which.

DESCRIPTION OF THE PREFERRED EMBODIMENTS

First Embodiment

Figure 1:
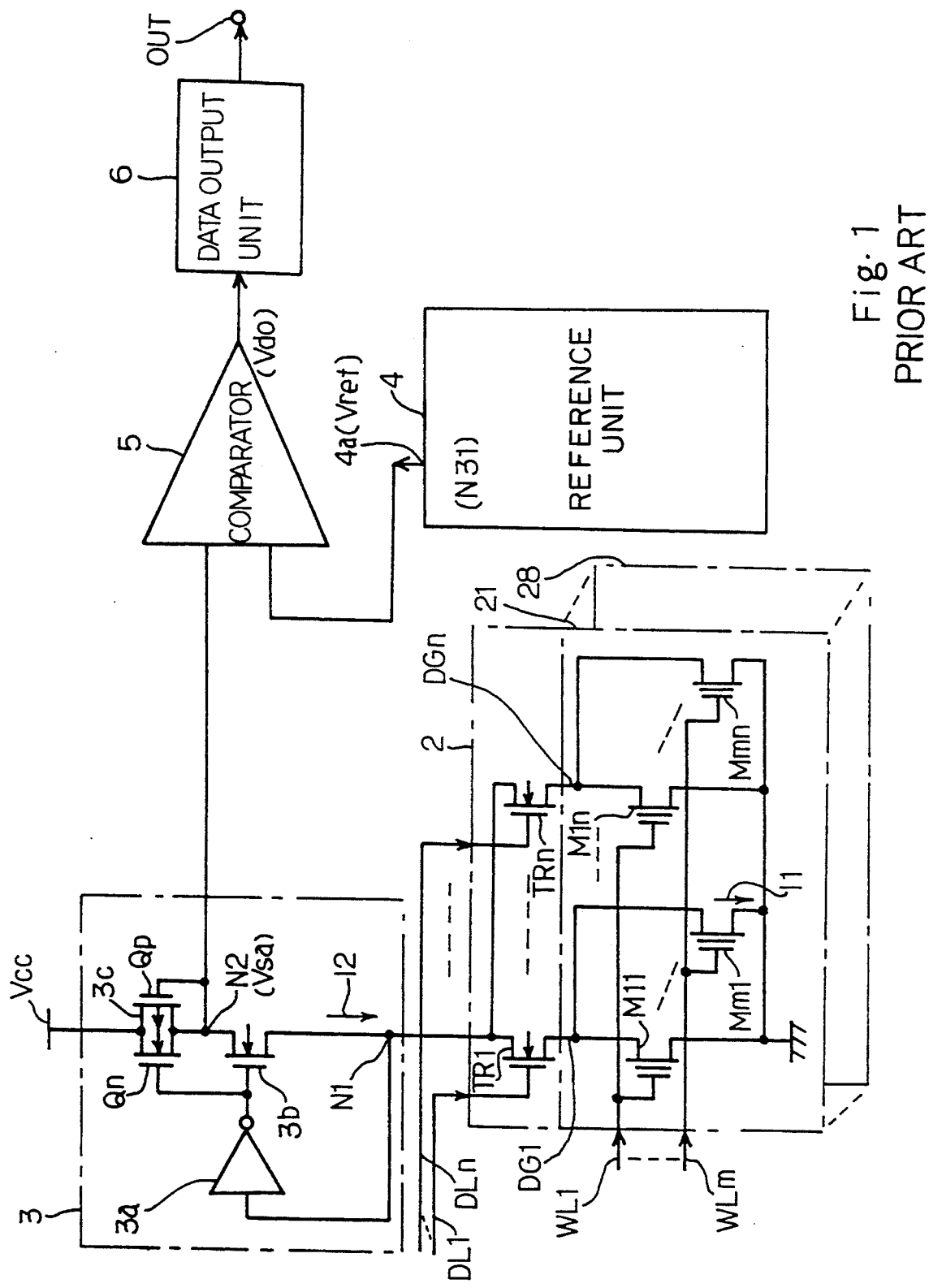
FIG. 1 is a circuit diagram showing the arrangement of the prior art electrically erasable and programmable read only memory device.
Figure 2:
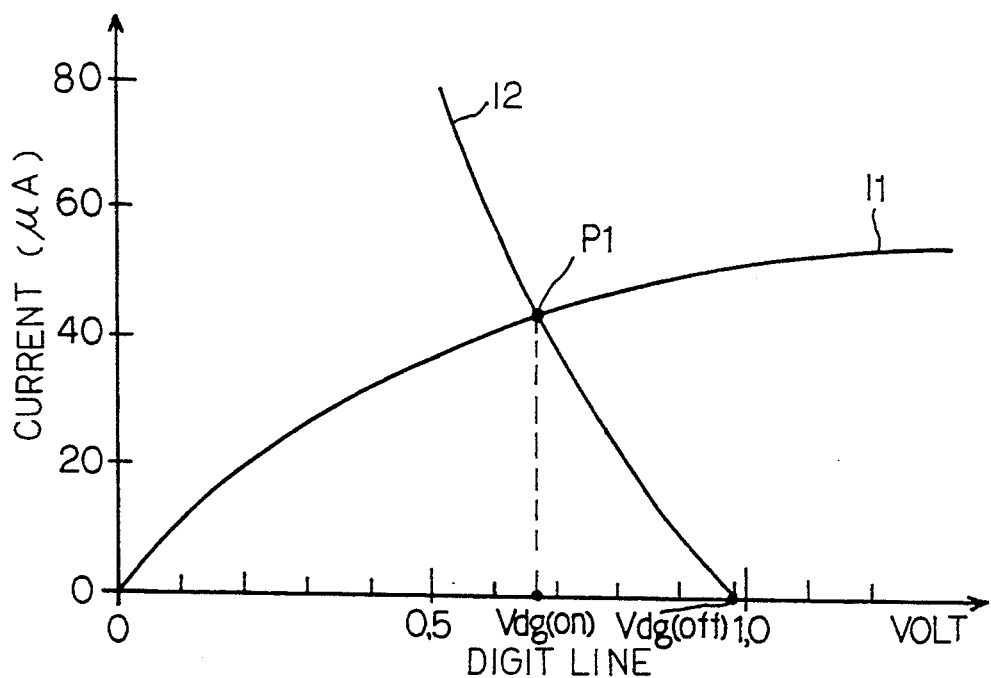
FIG. 2 is a graph showing current driving characteristics of a sense amplifier unit and a memory cell in terms of the voltage level on a digit line.
Figure 3:
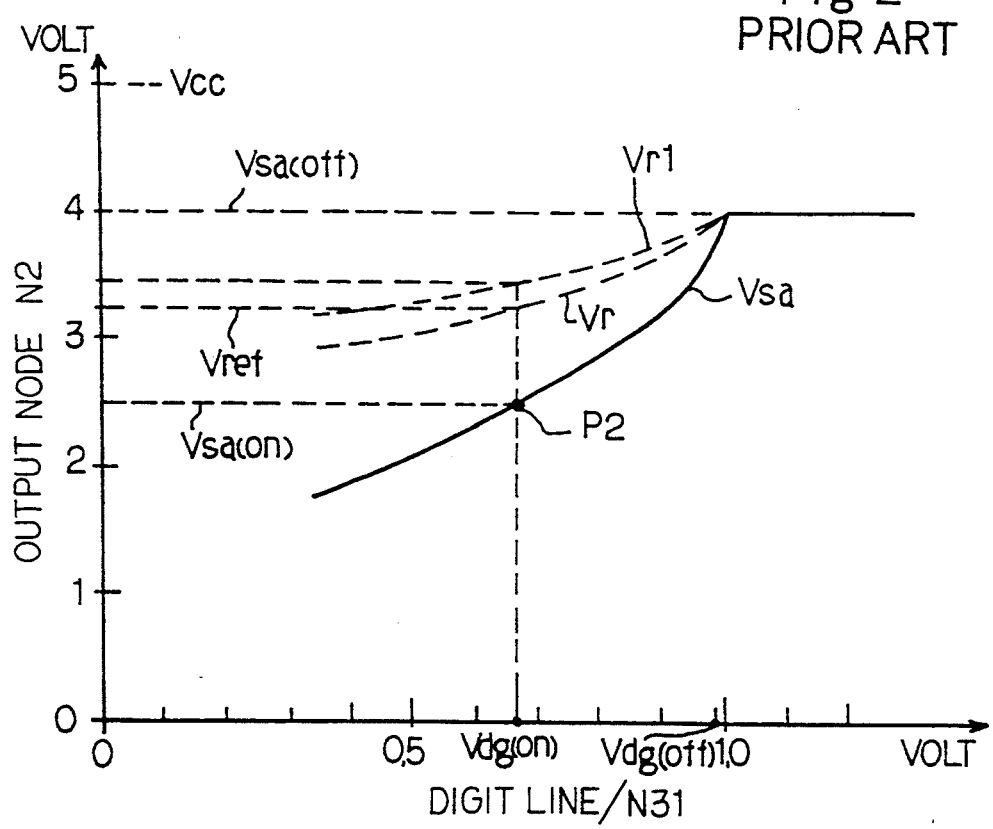
FIG. 3 is a graph showing the voltage level at the output node of the sense amplifier unit in terms of the voltage level on a digit line.
Figure 4:
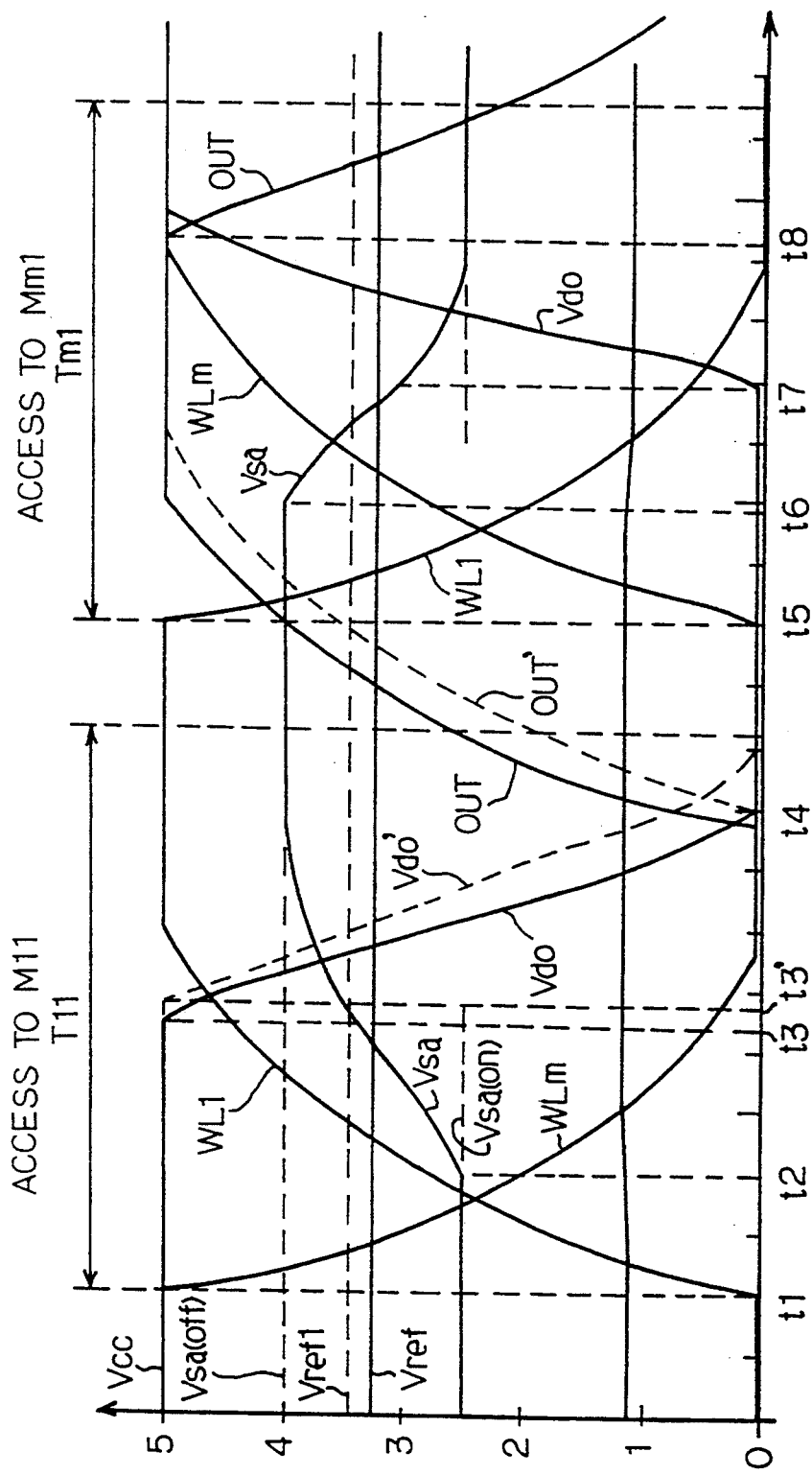
FIG. 4 is a diagram showing the waveforms of essential signals produced in the prior art electrically erasable and programmable read only memory device.
Figure 5:
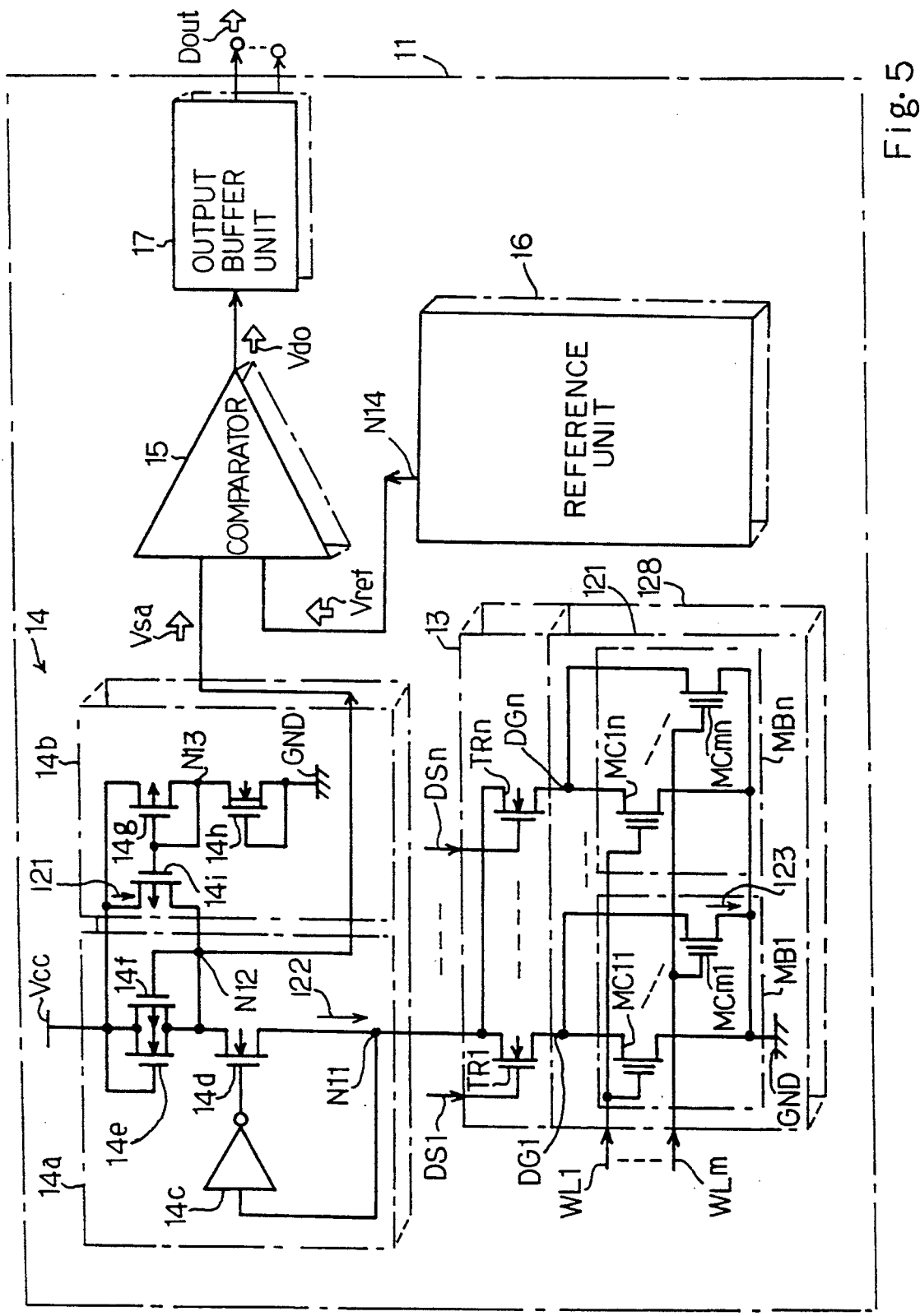
FIG. 5 is a circuit diagram showing the arrangement of an electrically erasable and programmable read only memory device according to the present invention.

Referring to FIG. 5 of the drawings, an electrically erasable and programmable read only memory device is fabricated on a single semiconductor chip 11. The electrically erasable and programmable read only memory device implementing the first embodiment is of the type producing an eight-bit output data signal, and, for this reason, eight memory cells arrays 121 to 128 are associated with eight sets of peripheral circuits. However, only one memory cell array 121 and a set of peripheral circuits associated thereto are described for the sake of simplicity.

The memory cell array 121 consists of a plurality of memory cell blocks MB1 to MBn respectively associated with digit lines DG1 to DGn, and the memory cell blocks MB1 to MBn are fabricated from a plurality of memory cells MC11 to MCm1 to MC1n to MCmn. The plurality of memory cells MC11 to MCmn are implemented by floating gate type field effect transistors, and selectively enter an erased state and a write-in state with a Fowler-Nordheim tunneling current. A plurality of word lines WL1 to WLm are provided for the memory cell arrays 121 to 128, and the word lines WL1 to WLm are coupled with the controlling gate electrodes of the floating gate type field effect transistors assigned to locations corresponding to one another in the memory cell blocks. For example, the word line WL1 is coupled with the memory cells MC11 to MC1n of the memory cell arrays 121 to 128. The word lines WL1 to WLm are selectively driven by a row address decoding unit (not shown) supplied with row address bits.

The eight memory cell arrays 121 to 128 are respectively associated with column address decoding units only one of which is shown and designated by reference numeral 13. The column selector unit 13 is implemented by transfer transistors TR1 to TRn coupled in parallel with the digit lines DG1 to DGn, respectively, and the transfer transistors TR1 to TRn are gated by decoded signal lines DS1 to DSn, respectively. The decodes signal lines DS1 to DSn are driven by a column address decoding unit (not shown), and column address bits are supplied to the column address decoding unit. Although the decoded signal lines DS1 to DSn are shared between the column selectors, no further description is incorporated hereinbelow. In this instance, the word lines WL1 to WLm associated with the row address decoding unit (not shown), the column selecting unit 13 and the decoded signal lines DS1 to DSn associated with the column address decoding unit (not shown) serve as a selecting means.

The column selector unit 13 is coupled with an input node N11 of a sense amplifier unit 14, and the sense amplifier unit 14 has a sense amplifier circuit 14a and a current make-up circuit 14b. The sense amplifier circuit 14a comprises an inverting circuit 14c coupled at the input node thereof with the input node N11, and the inverting circuit 14c causes a gate transistor 14d to selectively turn on and off depending upon the voltage level at the input node N11. In this instance, the gate transistor 14d is implemented by an n-channel enhancement type field effect transistor. The sense amplifier circuit 14a further comprises a transfer gate consisting of a parallel combination of an n-channel enhancement type field effect transistor 14e and a p-channel enhancement type field effect transistor 14f coupled between a source of positive voltage level Vcc and an output node N12 of the sense amplifier circuit 14a. The source of positive voltage level Vcc constantly produces a positive voltage level as high as about 5.0 volts. The n-channel enhancement type field effect transistor 14e has a gate electrode coupled to the source of positive voltage level Vcc, however, the gate electrode of the p-channel enhancement type field effect transistor 14f is coupled with the output node N12. The n-channel enhancement type field effect transistor 14e is higher in threshold level than the gate transistor 14d, and the n-channel enhancement type field effect transistor 14e is assumed to turn off when the output node N12 is decayed to about 2.5 volts. The gate transistor 14d and the inverting circuit 14c as a whole constitute a gate means, and the parallel combination of the n-channel enhancement type field effect transistor 14e and the p-channel enhancement type field effect transistor 14f form in combination a current supplying circuit.

The make-up circuit 14b comprises a series combination of a p-channel enhancement type field effect transistor 14g and an n-channel depletion type field effect transistor 14h coupled between the source of positive voltage level Vcc and a ground voltage line GND, and a p-channel enhancement type field effect transistor 14i coupled between the source of positive voltage level Vcc and the output node N12. The gate electrode of the n-channel depletion type field effect transistor 14th is coupled with the ground voltage line GND, and the common drain node N13 is shared between the p-channel enhancement type field effect transistors 14g and 14i. The n-channel depletion type field effect transistor 14th causes the common drain node N13 to be constant in voltage level, and the p-channel enhancement type field effect transistor 14i allows current I21 to flow into the output node N12. The amount of current I21 is roughly determined by the channel width-to-channel length ratio of the n-channel depletion type transistor 14h. For example, the channel width-to-channel length ratios of the field effect transistors 14g, 14h and 14i are assumed to be 5:5, 10:60 and 5:10, and the amount of current I21 is adjusted to about 10 micro-ampere.

The output node N12 is coupled with a first input node of a comparator unit 15, and the other input node thereof is coupled with an output node N14 of a reference unit 16. The reference unit 16 is arranged in similar manner to the reference unit 4, and produces a reference voltage level Vref at the output node N14. The sense amplifier unit 14 selectively produces output voltage levels Vsa(on) and Vsa(off) depending upon the state of a memory cell of the memory cell array 121 to be accessed, and the reference voltage level Vref is adjusted to an intermediate level between the output voltage levels Vsa(on) and Vsa(off). In this instance, the reference voltage level Vref is about 3.5 volts. The comparator unit 15 compares the output voltage level Vsa(on) or Vsa(off) with the reference voltage level Vref for shifting an output voltage signal Vdo. The output voltage signal Vdo is supplied to an output buffer unit 17, and the output buffer unit 17 produces an output data signal Dout indicative of the state of the memory cell to be accessed.

Figure 6:
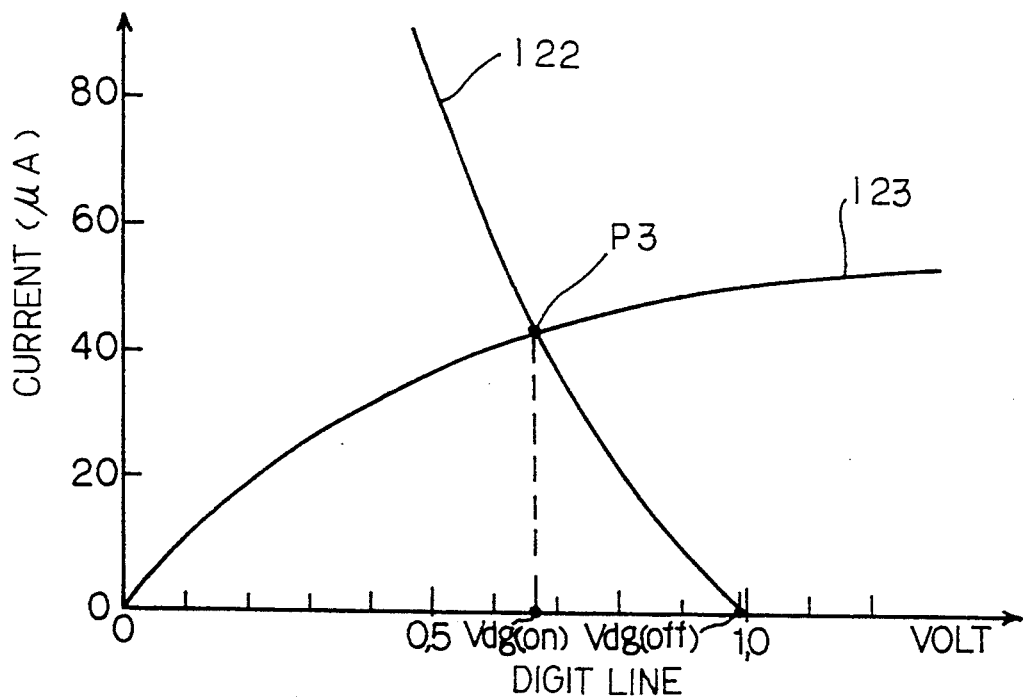
FIG. 6 is a graph showing the voltage level on a selected digit line in terms of current supplied thereto.
Figure 7:
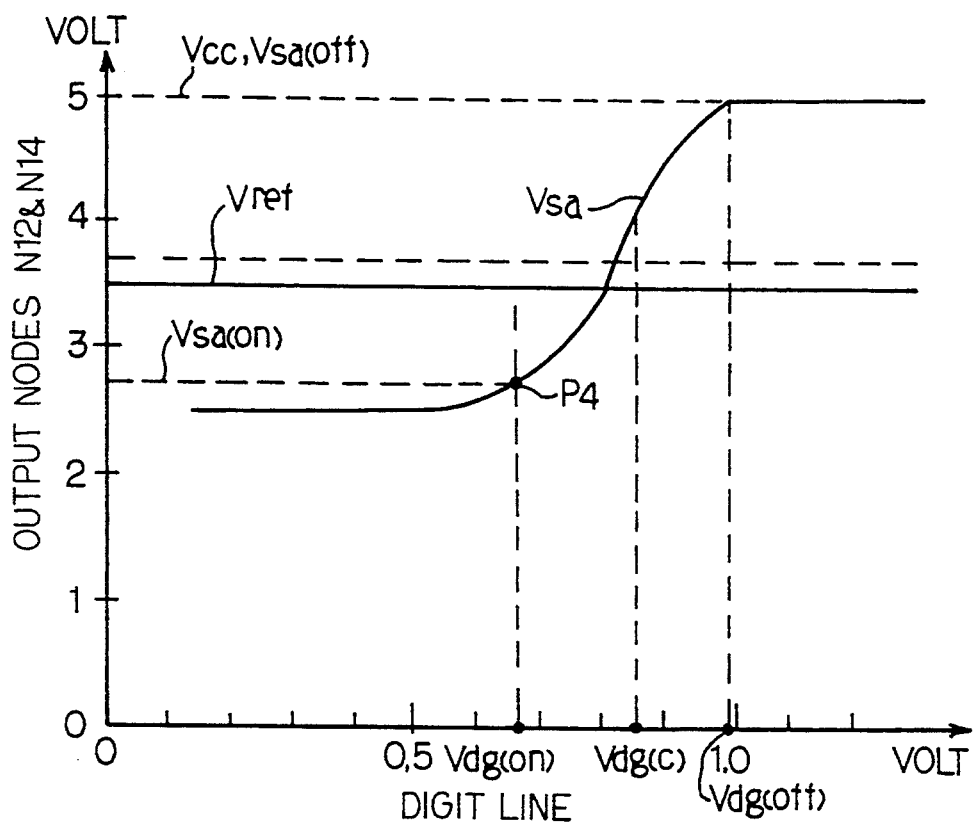
FIG. 7 is a graph showing the voltage level at the output node of the sense amplifier unit in terms of the voltage level on a selected digit line.

Characteristics of the sense amplifier unit 14 are hereinbelow described with reference to FIGS. 6 and 7. FIG. 6 shows the relation between current I22 supplied from the sense amplifier unit 14 and current I23 flowing through a memory cell to be accessed, and the relation between the voltage level on the selected digit line and the output voltage level Vsa at the output node N12 is illustrated in FIG. 7. Since a memory cell of the write-in state does not provides any current path from the associated digit line to the ground voltage line GND, the amount of current I22 is zero upon access thereto, and the voltage level on the associated digit line is regulated to Vdg(on). However, if the accessed memory cell is in the erased state, the voltage level Vdg(on) on the associated digit line is regulated to the crossing point P3 between plots I22 and I23 indicative of the amounts of current I22 and I23, respectively. Thus, the current-to-voltage characteristics for the selected digit line are similar to that of the prior art electrically erasable and programmable read only memory device, and are dominated by the characteristics of the inverting circuit 14c as well as the gate transistor 14d.

The output voltage level Vsa(on) is determined by the channel width-to-channel length ratio of the p-channel enhancement type field effect transistor 14f and the current I21. If the channel width-to-channel length of the p-channel enhancement type field effect transistor 14f is adjusted to 5:5, the output node N12 is balanced with the selected digit line at point P4 on plot Vsa indicative of the output voltage level Vsa. The n-channel enhancement type field effect transistor 14e turns on to supply current to the output node N12 upon access to a memory cell in the erased state, and, accordingly, prevents the output node N12 from excessive decay in voltage level. Therefore, the n-channel enhancement type field effect transistor 14e serves as a limiter. The channel width-to-channel length ratio of the n-channel enhancement type field effect transistor 14e is much larger than those of the p-channel enhancement type field effect transistors 14f and 14i, and is about 20:1.4 in this instance.

Relation between the voltage level on the digit line Vdg and the output voltage level Vsa is summarized as follows.

(A) If the voltage level Vdg on the selected digit line is equal to or greater than the voltage level Vdg(off), the gate transistor 14d turns off, and the output node N12 is charged by the p-channel enhancement type field effect transistor 14i. The output node N12 reaches the maximum voltage level as high as the positive voltage level Vcc, and the maximum voltage level is labeled with Vsa (off) in FIG. 7.

(B) If the voltage level Vdg is between the maximum voltage level Vdg (off) and a certain voltage level Vdg(c), the gate transistor 14d turns on, and the voltage level Vdg is determined through proportional division between the current driving capabilities between the p-channel enhancement type field effect transistor 14i and the gate transistor 14d. The plots Vsa draws a convex line. This is because of the fact that the current driving capability of the gate transistor 14d is increased with time; nevertheless the current driving capability of the p-channel enhancement type field effect transistor 14i constant.

(C) If the voltage level Vdg is between the certain voltage level Vdg(c) and the minimum voltage level Vdg(on), the channel conductance of the gate transistor 14d is further increased, and the output voltage level Vsa is determined by the proportional division between the total current driving capability of the p-channel enhancement type field effect transistors 14f and 14i and the current driving capability of the gate transistor 14d. The plot Vsa form a concave line as shown in FIG. 7. This is because of the fact that the current driving capability of the p-channel enhancement type field effect transistor 14f is increased when the output voltage level Vsa is decayed.

(D) If the voltage level Vdg is less than the minimum voltage level Vdg(on), the output voltage level Vsa becomes lower than the output voltage level Vsa(on). However, upon reaching 2.5 volts, the n-channel enhancement type field effect transistor 14e turns on to supply current, and the output voltage level Vsa can not be lower than 2.5 volts.

Figure 8:
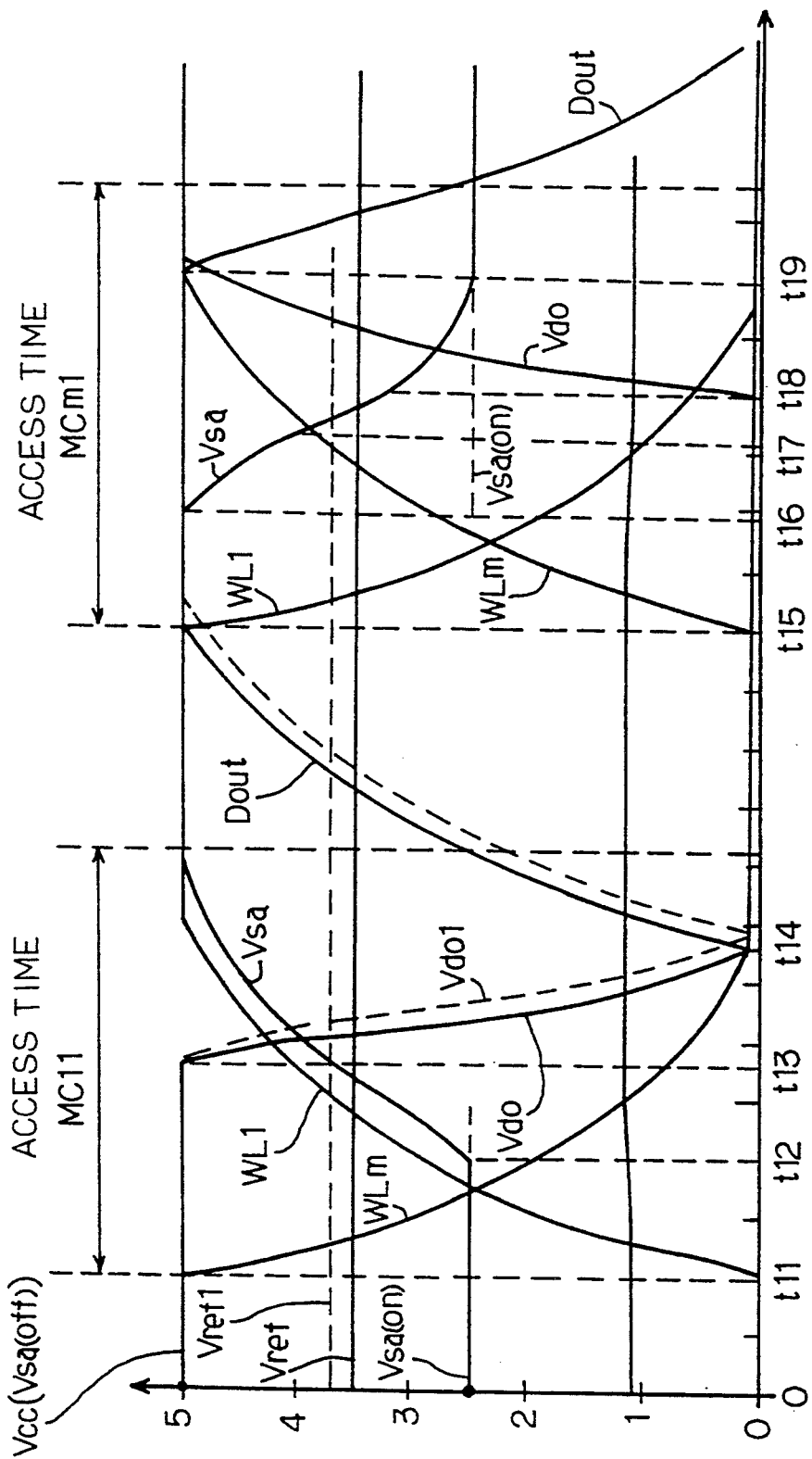
FIG. 8 is a diagram showing the waveforms of essential signals produced in the electrically erasable and programmable read only memory device shown in FIG. 5.

The circuit behaviors of the electrically erasable and programmable read only memory device is described hereinbelow with reference to FIG. 8. In the following description, an external device sequentially accesses the memory cell MC11 in the write-in state and the memory cell MCm1 in the erased state. If the row address bits indicative of the word line WL1 are supplied to the electrically erasable and programmable read only memory device, the row address decoding unit lifts the word line WL1 to an active high voltage level, and the word line WLm is recovered to an inactive low voltage level at time t11. Since the memory cell MC11 has entered into the write-in state, no conductive channel takes place between the associated digit line DG1 and the ground voltage line GND, and the digit line DG1 and the node N11 are charged up with the current I22. If the voltage level at the node N11 exceeds the threshold level of the inverting circuit 14c, the gate transistor 14d turns off, and the output node N12 is isolated from the node N11 at time t12. The output node N12 is elevated with current supplied from the p-channel enhancement type field effect transistors 14f and 14i.

If the output node N12 reaches about 4.0 volts at time t13, the p-channel enhancement type field effect transistor 14f turns off, and the output node N12 is charged up by the p-channel enhancement type field effect transistor 14i only. Since the reference voltage level Vref is adjusted to about 3.5 volts, the output node N12 is still coupled with the power voltage line Vcc through not only the p-channel enhancement type field effect transistor 14i but also the p-channel enhancement type field effect transistor 14f, and plot Vsa sharply exceeds the reference voltage level Vref. The gradient of the plot Vsa is so large that the output voltage signal Vdo is rapidly decayed from the high voltage level Vcc to the low voltage level around the ground voltage level. The output buffer unit 17 shifts the output data signal Dout from the low voltage level toward the high voltage level Vcc at time t15. As a result, the access time to the memory cell MC11 is shorter than that of the prior art electrically erasable and programmable read only memory-device.

New row address bits indicative of the word line WLm are decoded at time t15, and the word line WLm is lifted to the active high voltage level instead of the word line WL1. Since the memory cell MCm1 is in the erased state, the digit line DG1 and, accordingly, the node N11 are discharged through the memory cell MCm1, and the voltage level at the node N11 is decayed. The gate transistor 14d turns on at time t16, and the output node N12 is conducted to the digit line DG1. The output voltage level Vsa is decreased, and traces the voltage levels sequentially determined through the proportional division between the current driving capabilities of the field effect transistors 14i and 14d. If the output voltage level Vsa reaches about 4.0 volts, the p-channel enhancement type field effect transistor 14f turns on, and the plot Vsa traces the voltage levels determined through the proportional division between the total current driving capability of the p-channel enhancement type field effect transistors 14f and 14i and the current driving capability of the gate transistor 14d. Finally, the output node N12 reaches the minimum voltage level Vsa(on).

After the output voltage level Vsa is decreased under the reference voltage level Vref, the comparator unit 15 changes the output voltage signal Vdo from the low voltage level toward the high voltage level at time t18. With the output voltage signal Vdo, the output buffer unit 17 shifts the output data signal Dout from the high voltage level toward the low voltage level at time t19. Although the output voltage level Vsa is decayed toward the reference voltage level Vref slower than that of the prior art due to the maximum output voltage level as high as the positive voltage level Vcc, the voltage difference between the reference voltage level Vref and the minimum output voltage level Vsa(on) is larger than that of the prior art. For this reason, the comparator unit 15 is much more sensitive than the prior art unit 5, and the access time to the memory cell MCm1 in the erased state is as short as that of the prior art.

Assuming now that the reference unit 16 undesirably produces that reference voltage level Vref1 at the output node N14 which is slightly higher than the usual reference voltage level Vref, the output voltage level Vsa is increased toward the positive voltage level Vcc upon access to a memory cell in the write-in state, and the voltage difference between the minimum output voltage level Vsa(on) and the maximum output voltage level Vsa(off) is larger than that of the prior art. For this reason, the reference voltage level Vref1 is likely to fall within a range where both of the p-channel enhancement type field effect transistors 14f and 14i supply the current to the output node N12, and the plots Vsa is still sharp. This results in that only a small gap takes place between the plots indicative of the output voltage signal Vdo and plots indicative of the output voltage signal Vdo', and the access time to the memory cell in the write-in state is not so prolonged.

Second Embodiment

Figure 9:
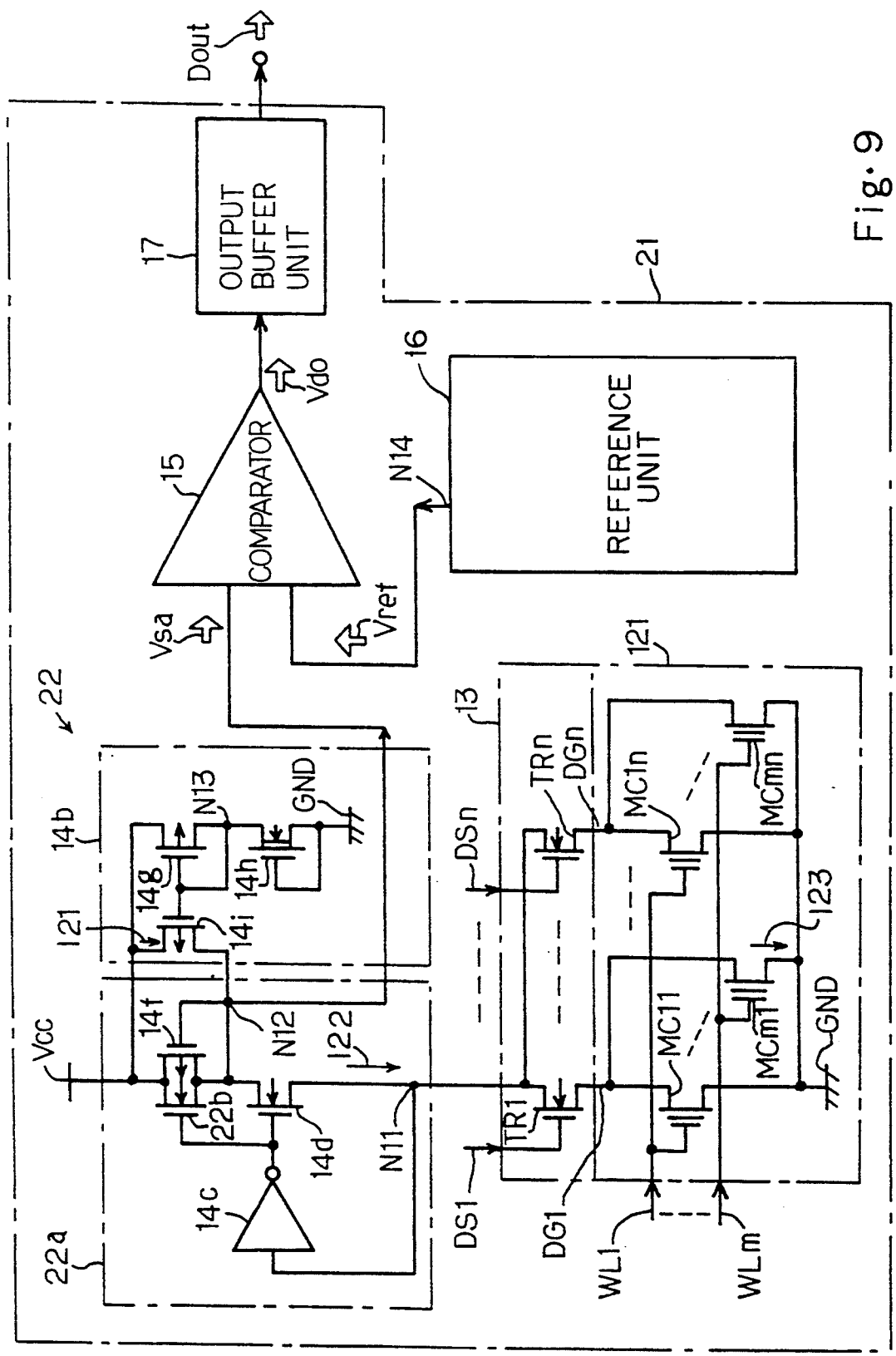
FIG. 9 is a block diagram showing the arrangement of another electrically erasable and programmable read only memory device according to the present invention.

Turning to FIG. 9 of the drawings, another electrically erasable and programmable read only memory device embodying the present invention is fabricated on a single semiconductor chip 21. The electrically erasable and programmable read only memory device implementing the second embodiment is similar in arrangement to the first embodiment except for a sense amplifier circuit 22a of a sense amplifier unit 22. For this reason, the other component units and transistors are labeled with the same references used in FIG. 5 without detailed description. In the sense amplifier circuit 22a, an n-channel enhancement type field effect transistor 22b corresponds to the n-channel enhancement type field effect transistor 14e, and is gated by the inverting circuit 14c similar to the prior art sense amplifier circuit 3. The voltage level Vdg on a selected digit line is varied depending upon the state of a selected memory cell, and, accordingly, the currents I22 and I23 trace the plots I22 and I23, respectively, similar to those shown in FIG. 6.

Figure 10:
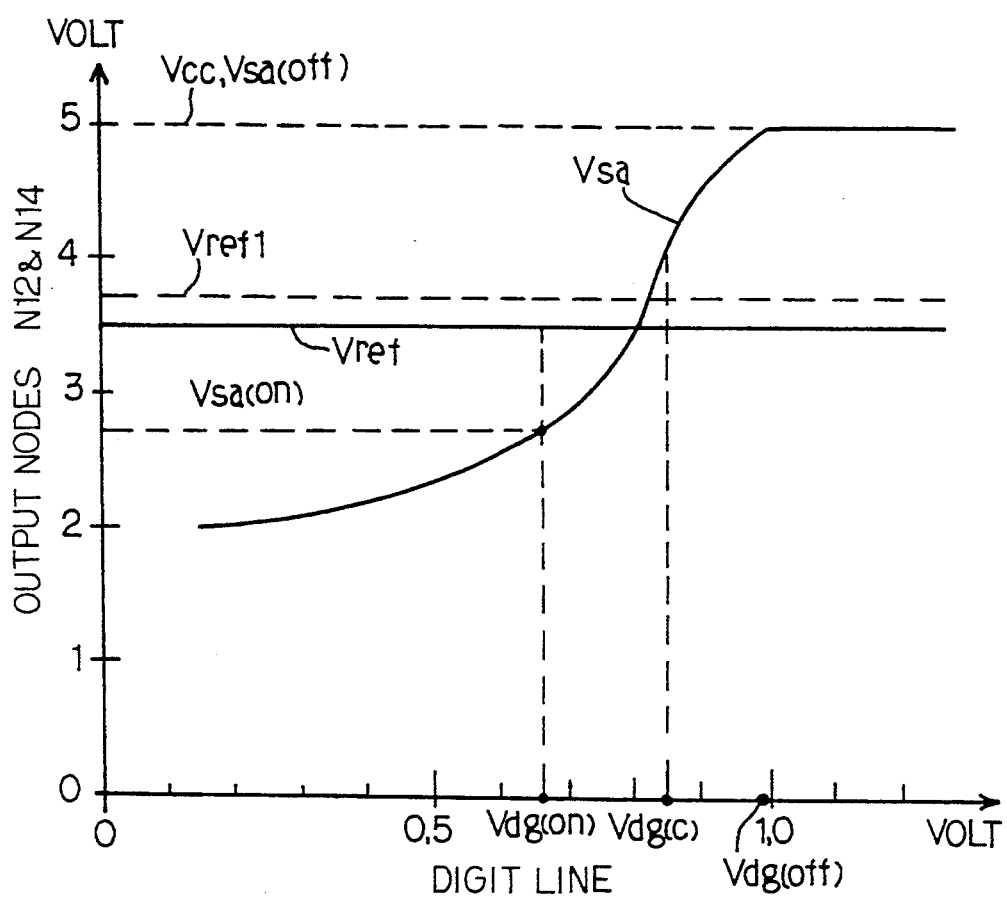
FIG. 10 is a graph showing the voltage level at the output node of the sense amplifier unit incorporated in the electrically erasable and programmable read only memory device shown in FIG. 9 in terms of the voltage level on a selected digit line.

However, the output voltage level Vsa is varied along plot Vsa in FIG. 10, and is lowered to a certain voltage level at which the n-channel enhancement type field effect transistor 22b turns on. In the second embodiment, the maximum output voltage level Vsa(off) is as high as that of the first embodiment, and all of the advantages of the first embodiment are achieved by the electrically erasable and programmable read only memory device implementing the second embodiment.

As will be appreciated from the foregoing description, the non-volatile semiconductor memory device according to the present invention steeply increases the output voltage level Vsa upon access to a memory cell in the write-in state by virtue of the current supplied from the make-up circuit 14b, and the access time is shrunk reduced from that of the prior art non-volatile semiconductor memory device. Moreover, the make-up circuit 14b allows the output node N12 to elevate to the power voltage level Vcc, and fluctuation of the reference voltage level Vref hardly affects the access time. The wide difference voltage increases noise margin. The minimum power voltage level for activating the sense amplifier circuit 14a or 22a is only determined by the threshold level of the inverting circuit 14c, and the sense amplifier circuit 14a or 22a is operative with a lower power voltage level.

Although particular embodiments of the present invention have been shown and described, it will be obvious to those skilled in the art that various changes and modifications may be made without departing from the spirit and scope of the present invention. For example, various arrangements may be employed for a non-volatile semiconductor memory device according to the present invention, and the memory cell may be an electrically programmable read only memory cell erased with, for example, ultra-violet radiation.

What is claimed is:

1. A non-volatile semiconductor memory device fabricated on a single semiconductor chip, comprising:
   a) a plurality of memory cells each selectively entering first and second states for changing the amount of current passing therethrough;
   b) a selecting means for selecting one of said plurality of memory cells;
   c) a sense amplifier unit for producing an output voltage level indicative of one of said first and second states, and having an input node coupled with said one of said plurality of memory cells, a gate means shifted between on and off states depending upon the state of said one of said plurality of memory cells for controlling a current path between said input node and an output node, a current supplying circuit for controlling the amount of current supplied from a first source of voltage level to said output node depending upon the voltage level at said output node, and a make-up circuit having a current mirror configuration for constantly supplementing current to said output node until said output node reaches a predetermined voltage level as high as said first source of voltage level regardless of fluctuations in the voltage level in said first source;
   d) a reference unit for producing a reference voltage level at an output node thereof; and
   e) a comparator means having a first input node coupled with said output node of said sense amplifier unit and a second input node coupled with said output node of said reference unit, and operative to compare the output voltage level with said reference voltage level for producing an output voltage signal indicative of said one of said first and second states.

2. A non-volatile semiconductor memory device as set forth in claim 1, in which said gate means comprises a gate transistor coupled between said input node and said output node of said sense amplifier unit, and an inverting circuit having an input node coupled with said input node of said sense amplifier unit and an output node coupled with a gate electrode of said gate transistor.

3. A non-volatile semiconductor memory device fabricated on a single semiconductor chip, comprising:
   a) a plurality of memory cells each selectively entering first and second states for changing the amount of current passing therethrough;
   b) a selecting means for selecting one of said plurality of memory cells;
   c) a sense amplifier unit for producing an output voltage level indicative of one of said first and second states, and having an input node coupled with said one of said plurality Of memory cells, a gate means shifted between on and off states depending upon the state of said one of said plurality of memory cells for controlling a current path between said input node and an output node, a current supplying circuit for controlling the amount of current supplied from a first source of voltage level to said output node, and a make-up circuit having a current mirror configuration for constantly supplementing current to said output node until said output node reaches a predetermined voltage level as high as said first source of voltage level regardless of voltage fluctuation of said first source, said gate means comprising a gate transistor coupled between said input node and said output node of said sense amplifier unit, and an inverting circuit having an input node coupled with said input node of said sense amplifier unit and an output node coupled with a gate electrode of said gate transistor, said current supplying circuit comprising a parallel combination of a first n-channel enhancement type field effect transistor and a first p-channel enhancement type field effect transistor coupled between said first source of voltage level and said output node of said sense amplifier unit, a gate electrode of said first n-channel enhancement type field effect transistor being coupled with said first source of voltage level, a gate electrode of said first p-channel enhancement type field effect transistor being coupled with said output node of said sense amplifier unit;

d) a reference unit for producing a reference voltage level at an output node thereof; and e) a comparator means having a first input node coupled with said output node of said sense amplifier unit and a second input node coupled with said output node of said reference unit, and operative to compare the output voltage level with said reference voltage level for producing an output voltage signal indicative of said one of said first and second states.

4. A non-volatile semiconductor memory device as set forth in claim 2, in which said current supplying circuit comprises a parallel combination of a first n-channel enhancement type field effect transistor and a first p-channel enhancement type field effect transistor coupled between said first source of voltage level and said output node of said sense amplifier unit, a gate electrode of said first n-channel enhancement type field effect transistor being coupled with the output node of said inverting circuit, a gate electrode of said first p-channel enhancement type field effect transistor being coupled with said output node of said sense amplifier unit.

* * * * *